United States Patent
Cho et al.

(10) Patent No.: US 7,187,082 B2
(45) Date of Patent: Mar. 6, 2007

(54) SEMICONDUCTOR DEVICES HAVING A POCKET LINE AND METHODS OF FABRICATING THE SAME

(75) Inventors: Jun-Kyu Cho, Gyeonggi-do (KR); Young-Joon Choi, Songpa-gu (KR); Byung-Yong Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 227 days.

(21) Appl. No.: 10/942,367

(22) Filed: Sep. 15, 2004

(65) Prior Publication Data

US 2005/0056935 A1    Mar. 17, 2005

(30) Foreign Application Priority Data

Sep. 16, 2003    (KR)    .................... 10-2003-00694237

(51) Int. Cl.
*H01L 29/40*    (2006.01)
(52) U.S. Cl. ........................................ 257/763; 257/734
(58) Field of Classification Search ................ 257/734, 257/763
See application file for complete search history.

(56) References Cited

U.S. PATENT DOCUMENTS 6,159,835 A * 12/2000 Visokay et al. ............. 438/592
6,838,737 B2 * 1/2005 Kim et al. .................. 257/382
7,081,409 B2 * 7/2006 Kang et al. ................. 438/681
2002/0022355 A1    2/2002 Kim

FOREIGN PATENT DOCUMENTS

KR    2000-0027369    5/2000

OTHER PUBLICATIONS

English language abstract of Korean Publication No. 2000-0027369.

* cited by examiner

*Primary Examiner*—Roy Potter
(74) *Attorney, Agent, or Firm*—Marger Johnson & McCollom, P.C.

(57) ABSTRACT

In one embodiment, a semiconductor device comprises an active region isolated by a device isolation layer placed in a semiconductor substrate having a main surface. A molding hole is placed in the semiconductor substrate on the active region. A pocket insulating layer pattern conformally covers the molding hole. A pocket line extends across the active region, filling the molding hole and protruding from the main surface of the semiconductor substrate. The pocket line includes a pocket conductive layer line, a lower metal layer line, and an upper metal layer line, which are sequentially stacked on the pocket insulating later pattern. The device further may further include a line capping layer pattern placed on the pocket line. The line capping layer pattern and the pocket conductive layer line may surround the lower and upper metal layer lines.

11 Claims, 13 Drawing Sheets

SEMICONDUCTOR DEVICES HAVING A POCKET LINE AND METHODS OF FABRICATING THE SAME

CROSS-REFERENCE TO RELATED APPLICATION

This patent application claims priority from Korean Patent Application No. 2003-64237 filed on Sep. 16, 2003, the contents of which are hereby incorporated by reference in their entirety.

BACKGROUND OF THE INVENTION

1. Field of the Invention

The invention relates to semiconductor devices and methods of fabricating the same and more particularly, to semiconductor devices having a pocket line and methods of fabricating the same.

2. Description of the Related Art

A semiconductor device has discrete elements that are subject to a size reduction due to the application of the new high-technology in recent years, on a semiconductor substrate, in order to comply with the demand for increasing high-integration of a semiconductor device. Among the discrete elements, a transistor has been fabricated to be smaller than sub-micron to half-micron grade. The transistor includes gate lines having a doped polysilicon layer and at least one metal layer stacked thereon, spacers placed on the side walls of the gate lines, and source/drain regions formed in a semiconductor substrate and overlapping both ends of the gate lines.

The gate lines typically have a flat-stacked structure on the semiconductor substrate if they are a size greater than or equal to a submicron. However, since gate lines having such a structure may be easily oxidized at their side walls during a semiconductor thermal oxidation process followed by the process of forming the gate lines, this process may result in the gate lines being smaller than the predetermined width and length which were intended at the process of forming the gate lines. Also, the resistance of the gate lines may be increased since the metal layer is oxidized more quickly than the polysilicon layer during the semiconductor thermal oxidation process in the fabrication of the semiconductor device.

One of the methods of forming the gate lines of less than a half micron grade includes forming a trench hole in a semiconductor substrate having a molding layer, forming a gate oxide layer in the trench hole, and allowing the gate lines to contact the trench hole having the gate oxide layer. The gate lines are structured to include a polysilicon layer, a metal layer, and an oxidation stop layer, which are sequentially stacked. Thus, in order to prevent the metal layer from being oxidized during the semiconductor thermal oxidation process, the gate lines have the stacked structure described as above, in which the metal layer is encapsulated by the polysilicon layer and the oxidation stop layer. However, this method is limited in increasing the contact area between the gate lines and the semiconductor substrate as a channel length of the gate lines. The reason is the difficulty of filling the gate lines in the trench hole without voids without adjusting the depth of the trench hole due to the molding layer. Therefore, the contact area between the gate lines and the semiconductor substrate, and the thickness of the molding layer are important considerations for the semiconductor fabrication processes in order to properly place the gate lines in the trench hole.

On the other hand, U.S. Pat. No. 6,159,835 (the '835 patent) discloses an encapsulated low resistance gate structure and method for forming same. According to the '835 patent, the method includes forming a polysilicon layer on a semiconductor substrate having a gate oxide layer, forming a sacrificial layer on the upper surface of the polysilicon layer, forming a trench to expose the polysilicon layer by etching a predetermined portion of the sacrificial layer, and forming a sidewall layer placed on the side walls of the trench and extended to the upper surface of the polysilicon layer.

Then, the method further includes forming a barrier layer on the upper surface of the polysilicon layer, forming a metal layer placed on the barrier layer to partially fill the trench, forming an upper dielectric layer placed on the metal layer, removing the sacrificial layer, and etching the polysilicon layer by using the gate oxide layer as an etch stop layer. At this time, the barrier layer can be formed on the polysilicon layer first before the sacrificial layer is formed.

Because this method provides a gate having a polysilicon layer pattern, a barrier layer pattern and a metal layer pattern, the gate structure shows better resistance characteristics compared to only using one polysilicon layer pattern in the gate However, while this method may prevent the oxidation of the metal layer pattern by using the polysilicon layer pattern and the upper dielectric layer after forming the gate, it cannot prevent the oxidation of the side walls of the polysilicon layer pattern. Further, because the metal layer pattern is in contact with the sidewall layer pattern, the sidewall layer pattern may be torn off during a subsequent process to oxidize the metal layer pattern.

Therefore, the length of the gate channel can be reduced less than the size of the gate before the oxidation has occurred, and the current driving capability of the semiconductor device having the gate may be decreased.

SUMMARY OF THE INVENTION

In one embodiment, a semiconductor device comprises an active region isolated by a device isolation layer placed in a semiconductor substrate having a main surface. A molding hole is placed in the semiconductor substrate on the active region. A pocket insulating layer pattern conformally covers the molding hole. A pocket line extends across the active region, filling the molding hole and protruding from the main surface of the semiconductor substrate. The pocket line includes a pocket conductive layer line, a lower metal layer line, and an upper metal layer line, which are sequentially stacked on the pocket insulating later pattern. The pocket conductive layer line prevents lower and upper metal lines from being oxidized. Thus, the performance of the semiconductor device having the pocket line will be improved.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Figure 1:
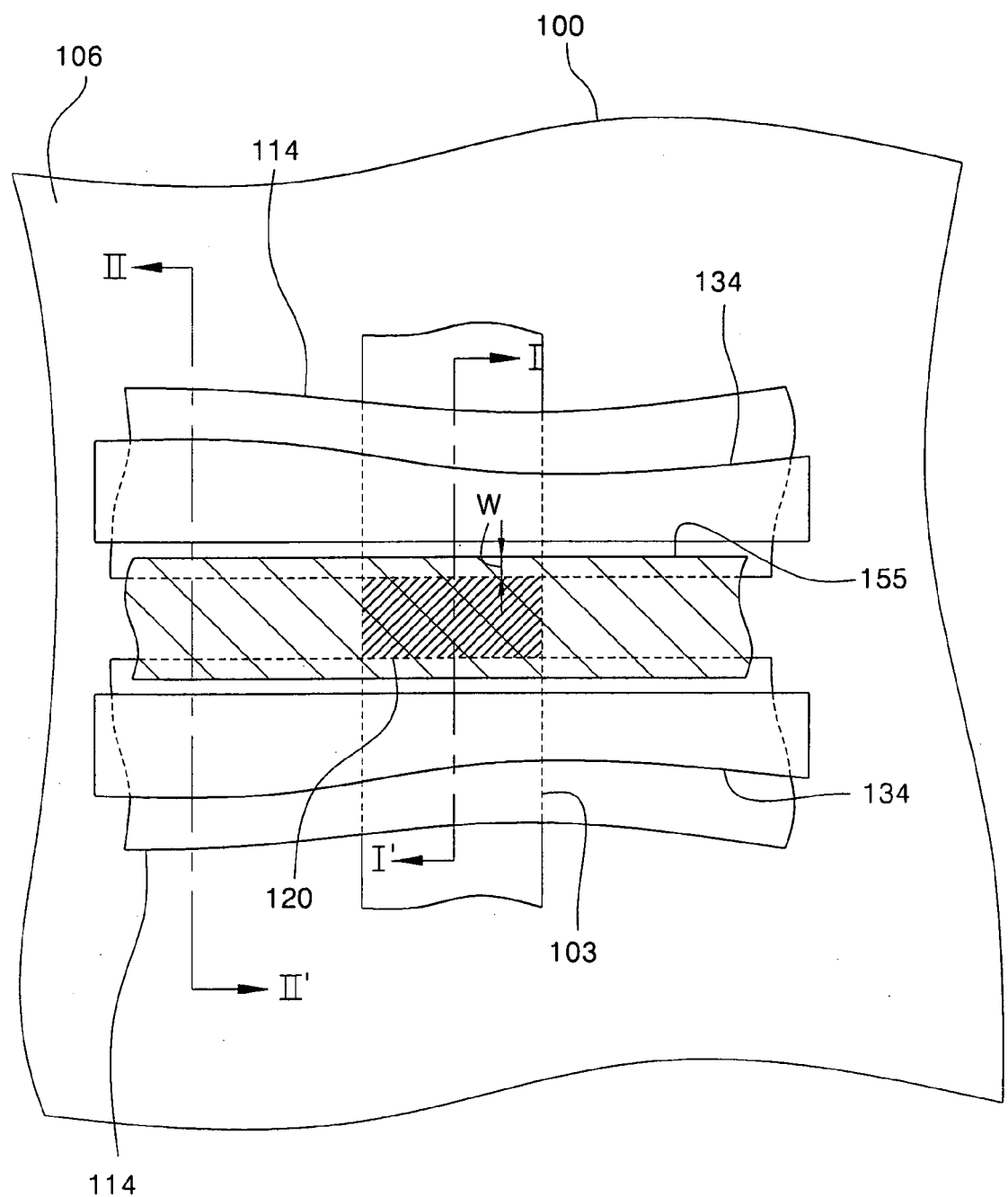
FIG. 1 is a plan view of a semiconductor device according to the invention.
Figure 2:
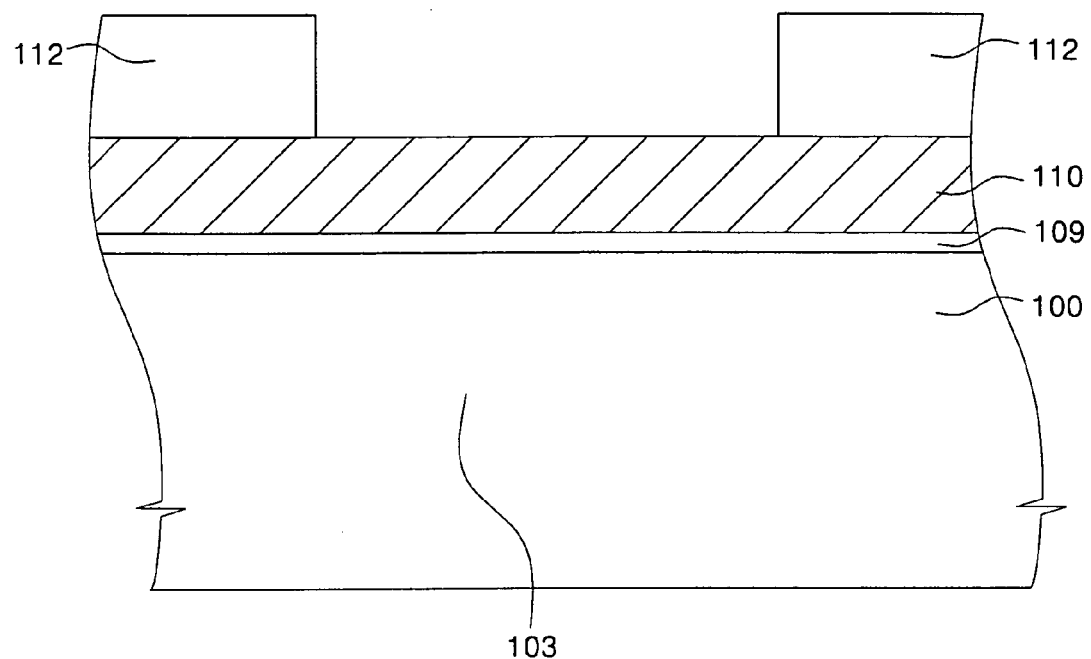
FIGS. 2, 4, 6, 8, 10, 12, 14, and 16 are sectional views illustrating a method of fabricating the semiconductor device taken along the line I–I' of FIG. 1, respectively.
Figure 3:
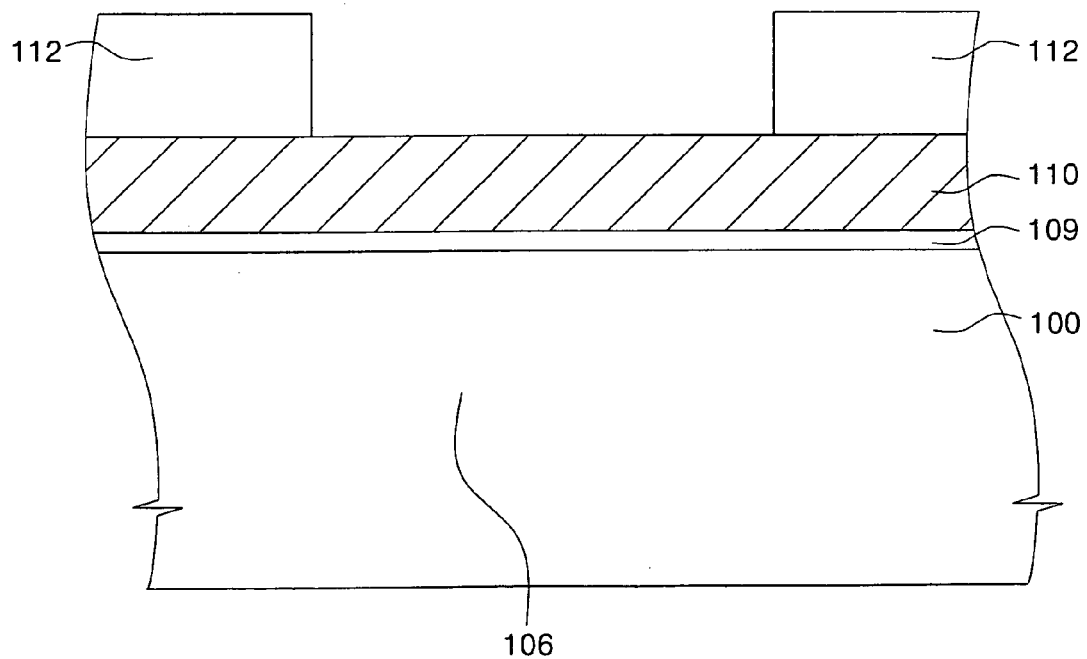
FIGS. 3, 5, 7, 9, 11, 13, 15, and 17 are sectional views illustrating a method of fabricating the semiconductor device taken along the line II–II' of FIG. 1, respectively.
Figure 4:
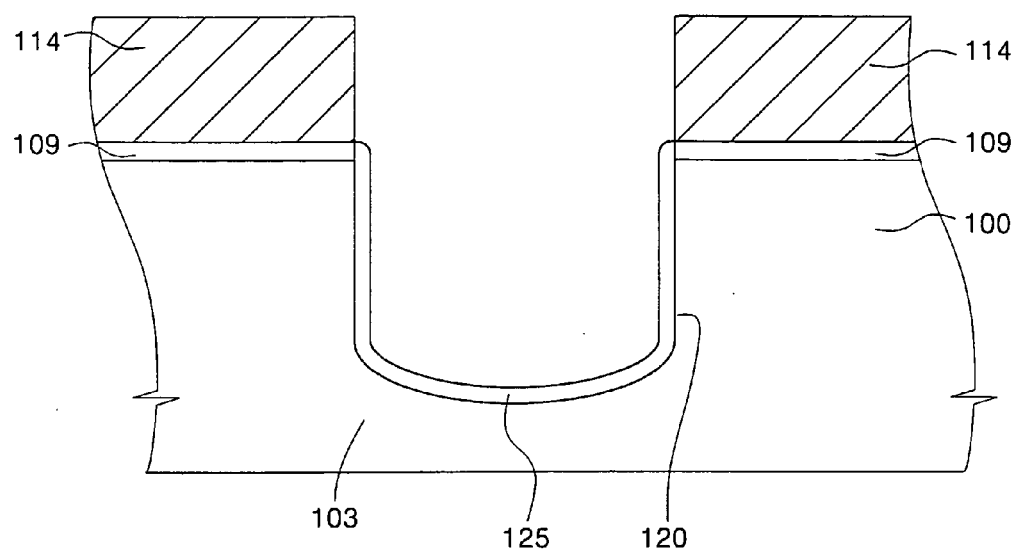
Figure 5:
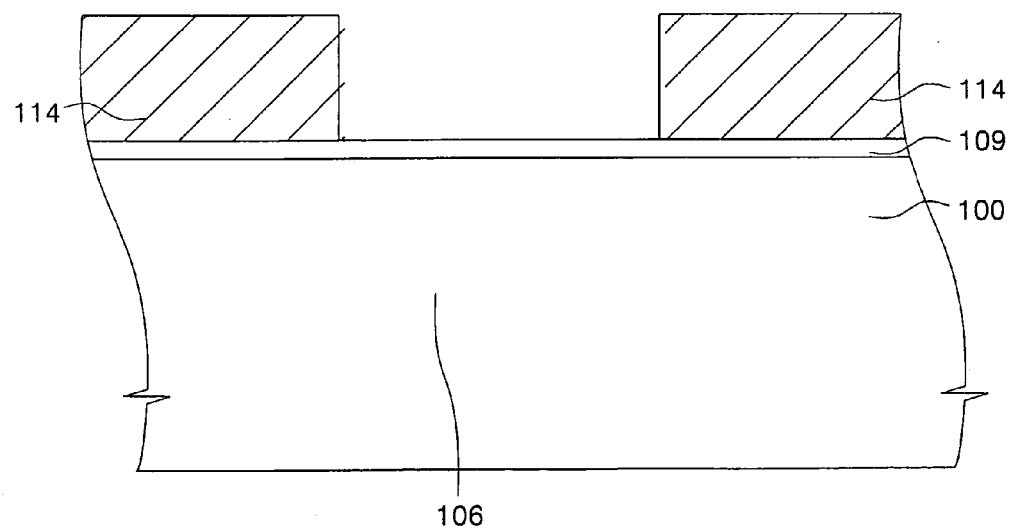
Figure 6:
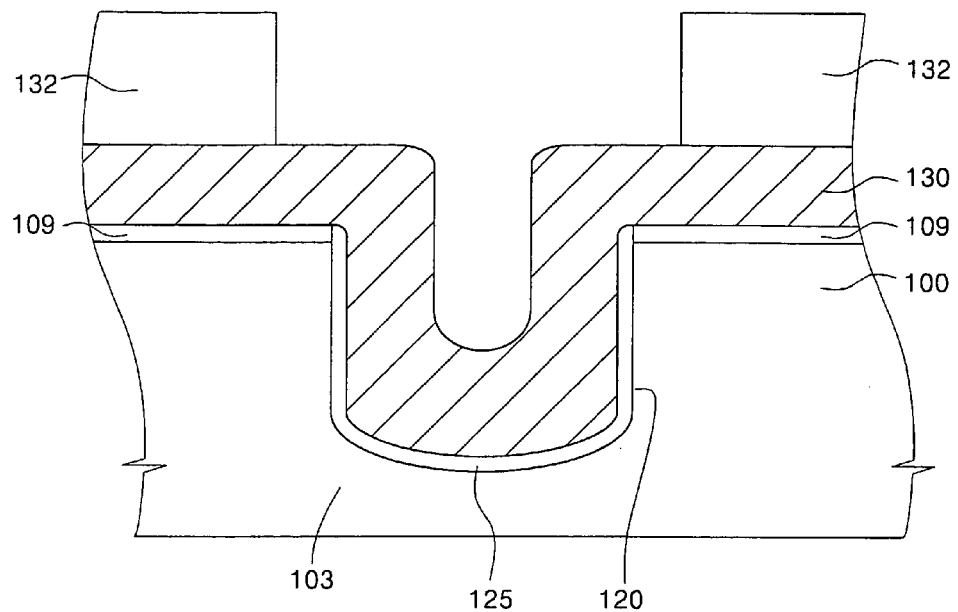
Figure 7:
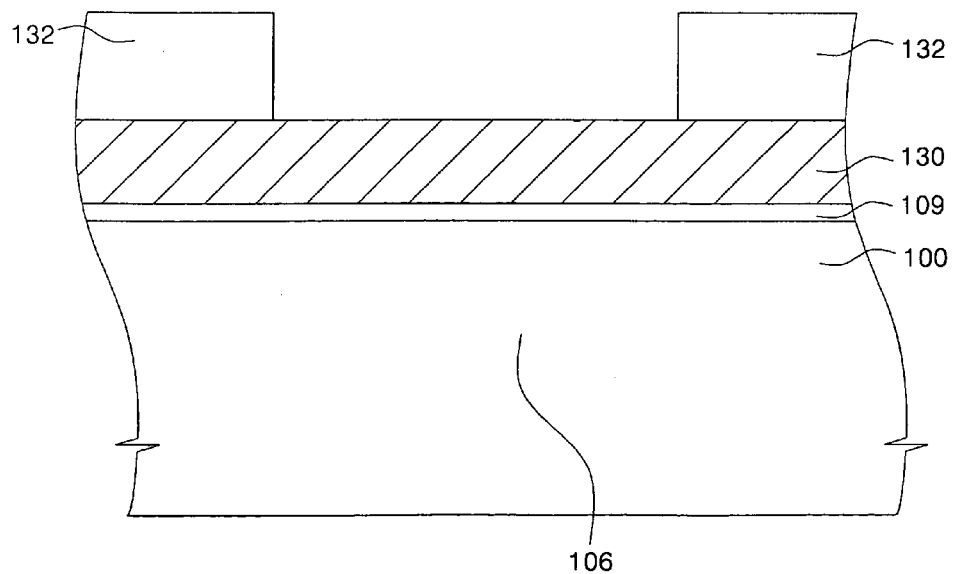
Figure 8:
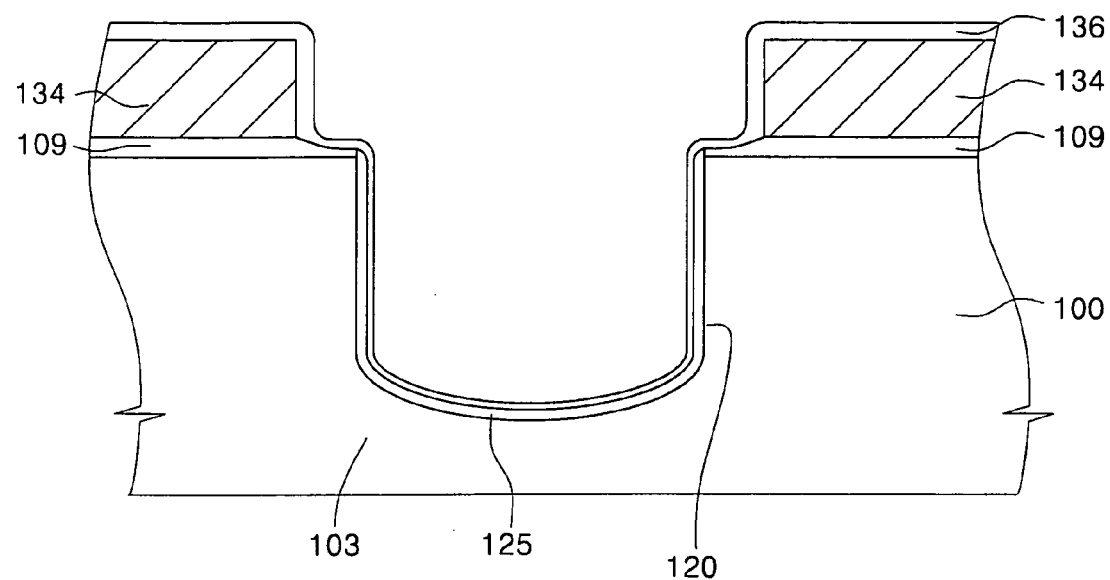
Figure 9:
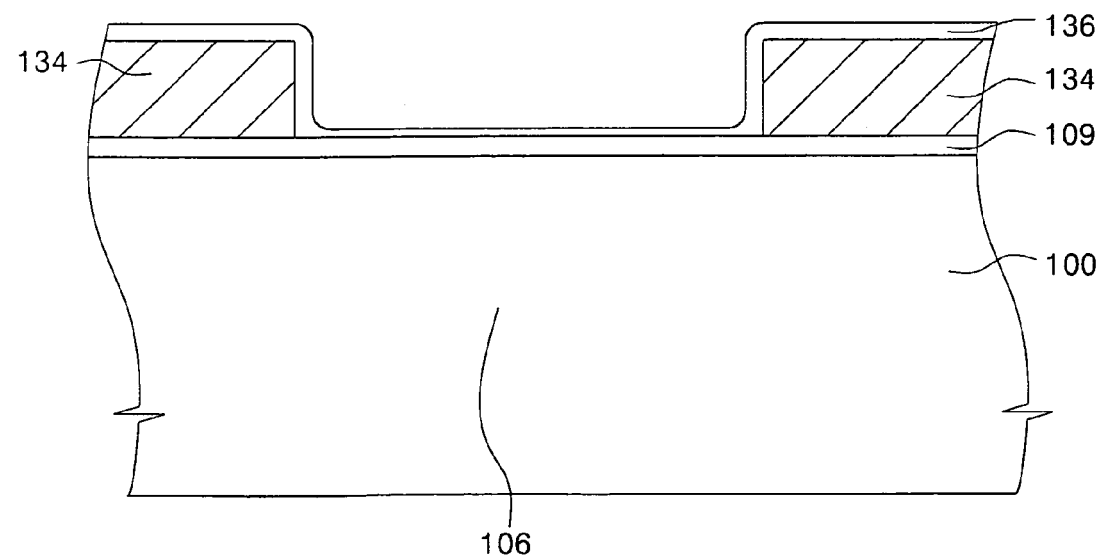
Figure 10:
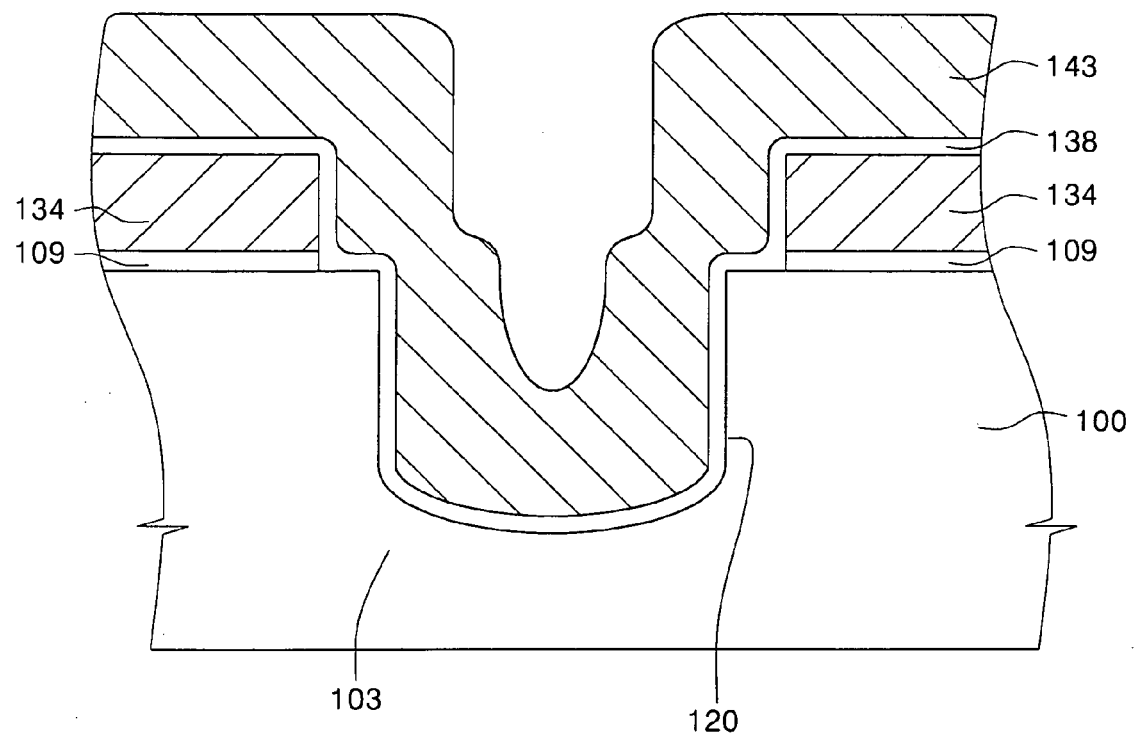
Figure 11:
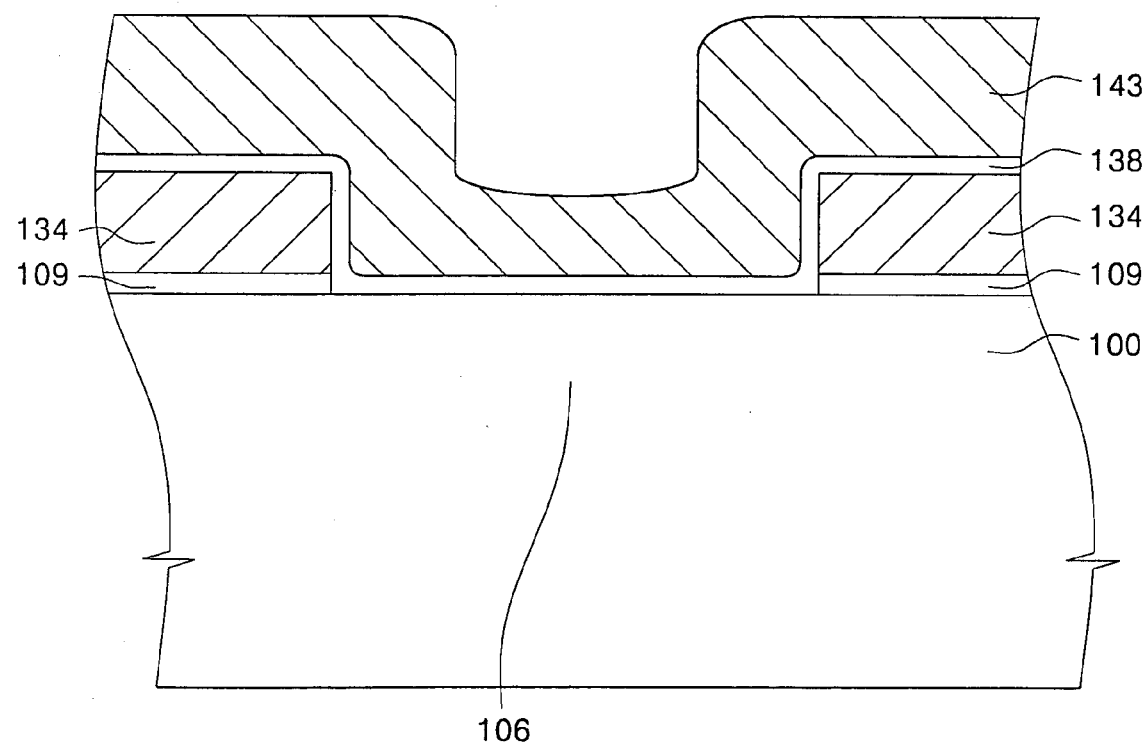
Figure 12:
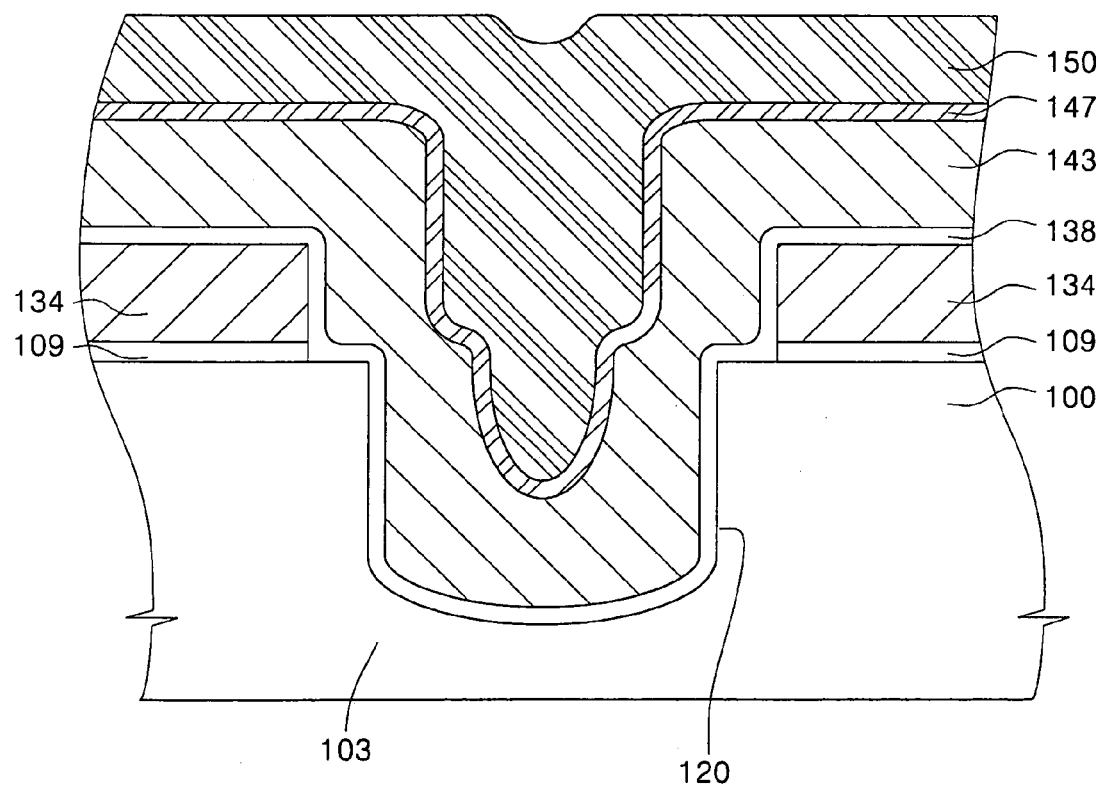
Figure 13:
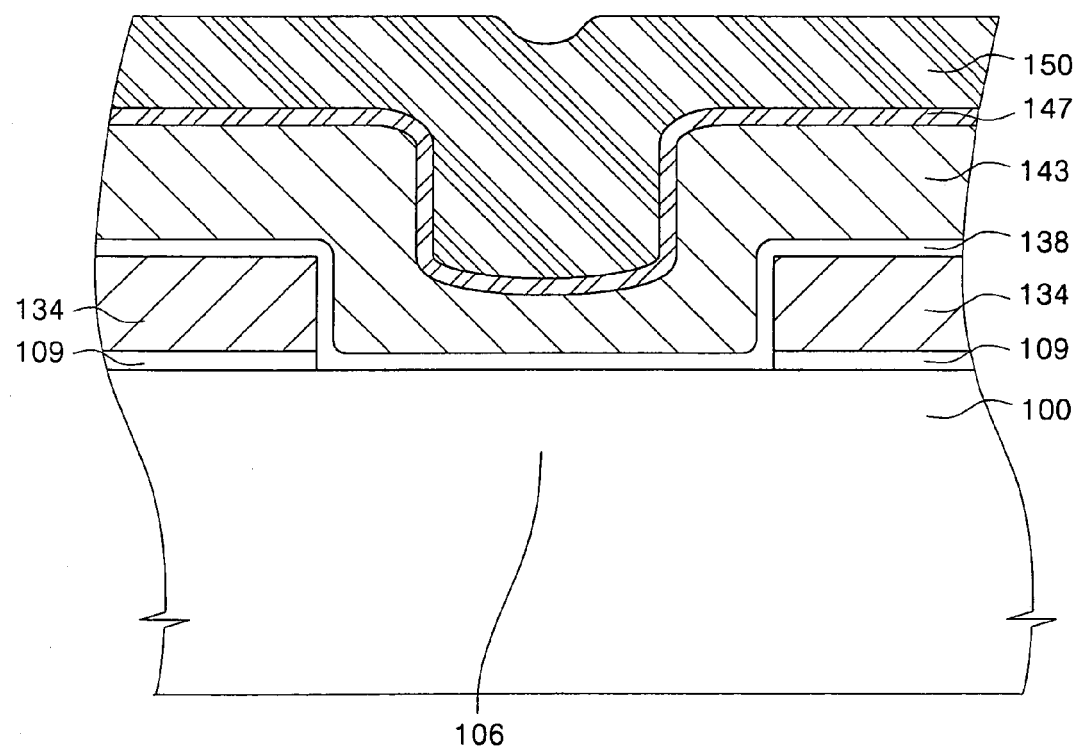
Figure 14:
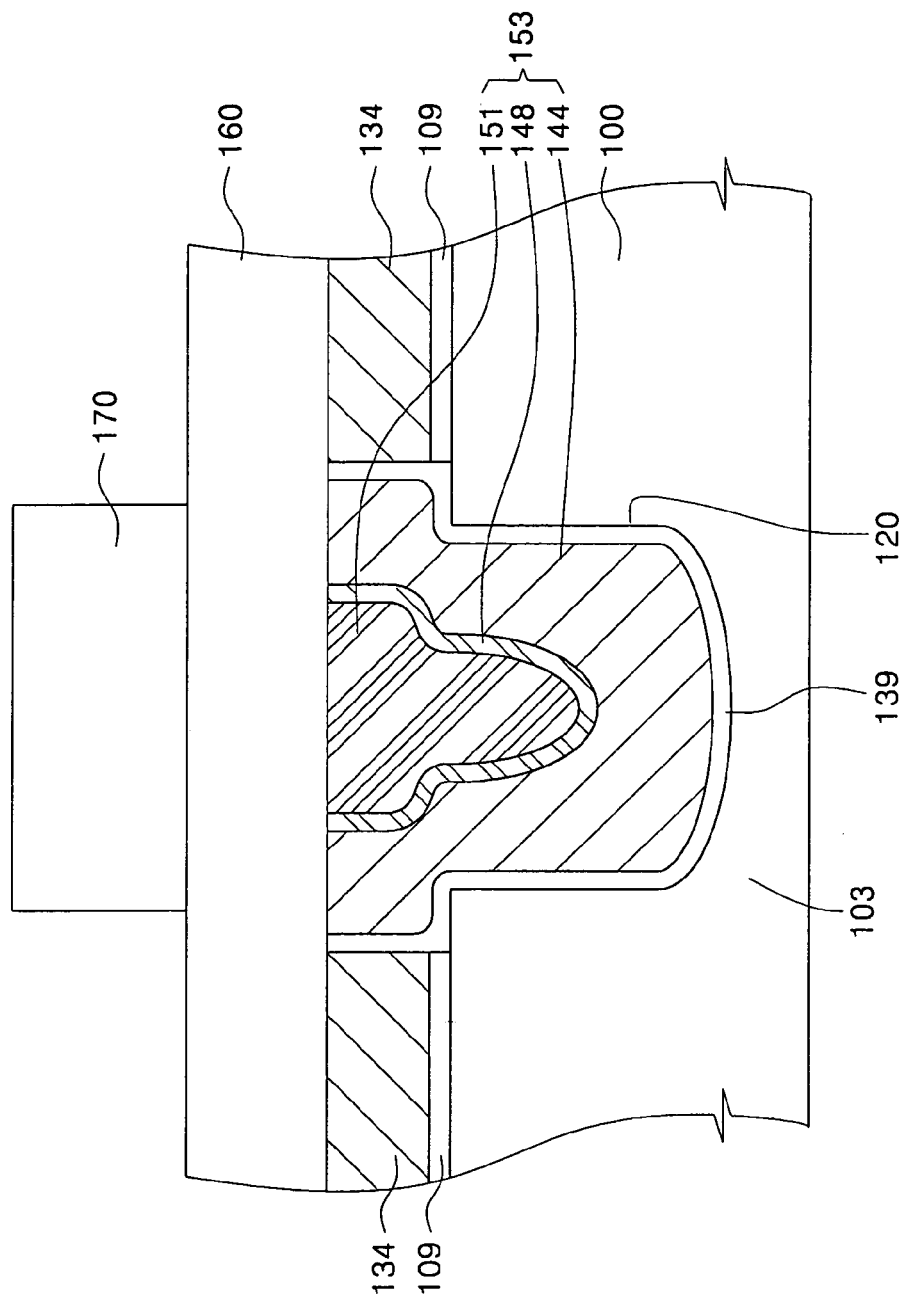
Figure 15:
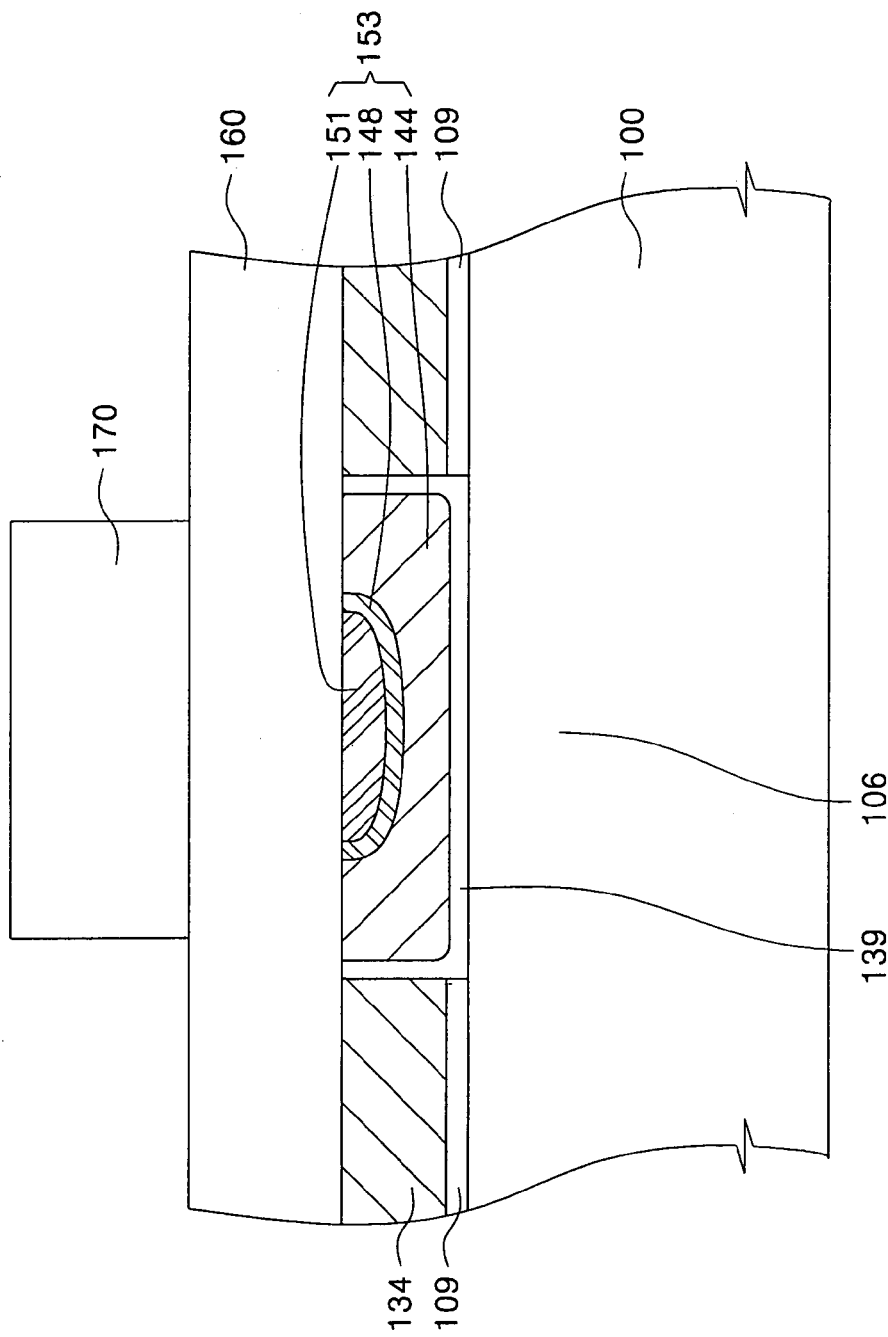
Figure 16:
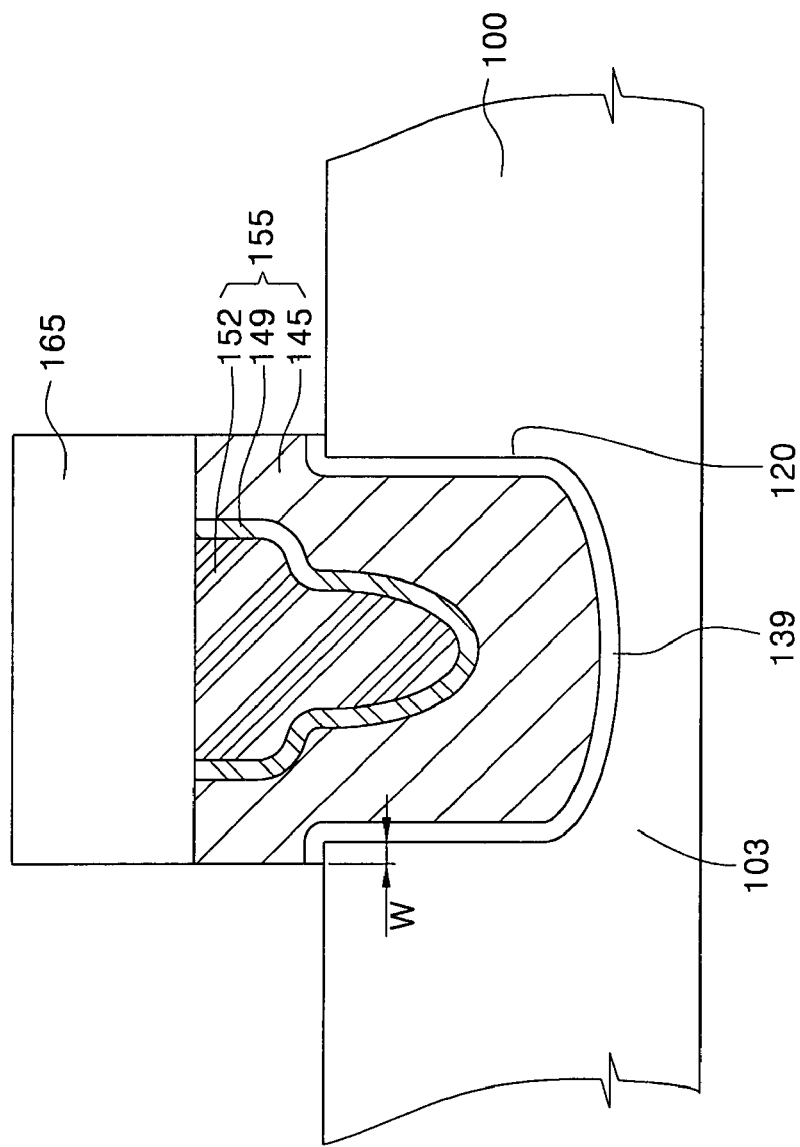
Figure 17:
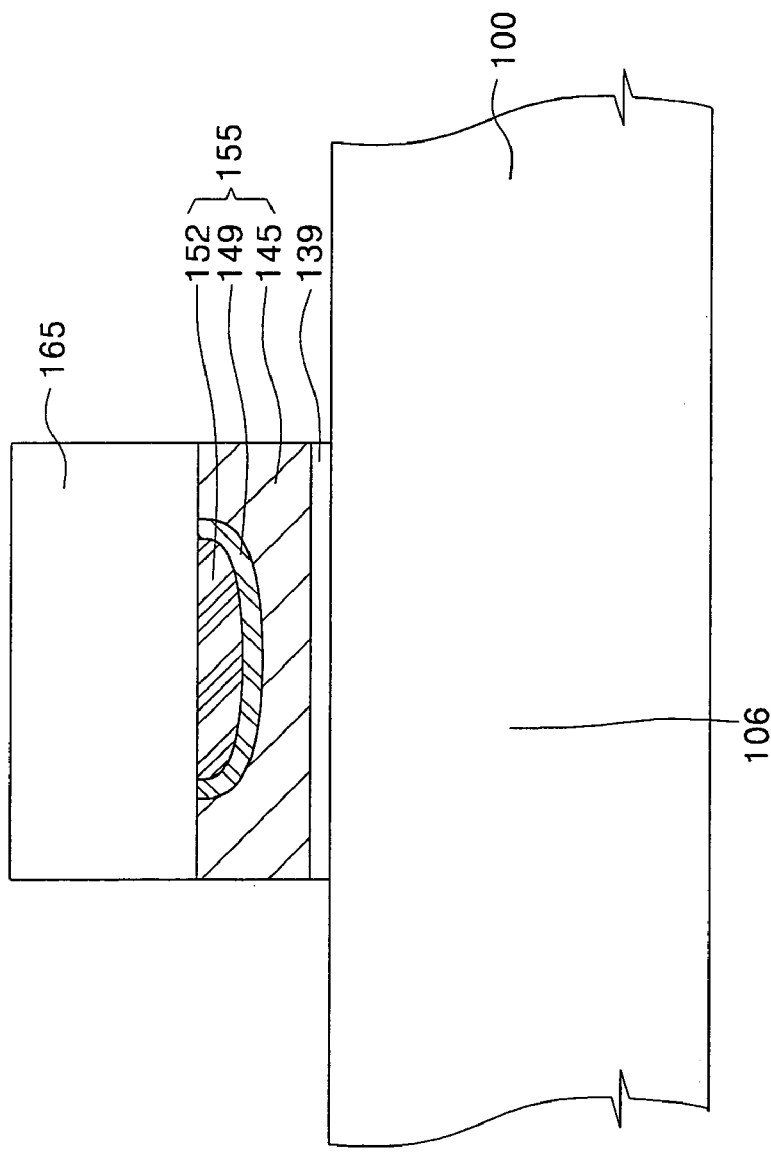

Reference will now be made in detail to exemplary embodiments of semiconductor devices having a pocket line and methods of fabricating the same of the invention, which are illustrated in the accompanying drawings FIG. 1 is a plan view of a semiconductor device according to an embodiment of the invention, and FIGS. 16 and 17 are sectional views of the semiconductor device taken along lines of I–I' and II–II' of FIG. 1, respectively.

Referring to FIGS. 1, 16, and 17, at least one active region 103, which is isolated by a device isolation layer 106, is placed on a semiconductor substrate 100. A molding hole 120 is placed in the semiconductor substrate 100 on the active region 103.

A pocket line 155 is placed to traverse a direction perpendicular to the active region 103 as shown in FIG. 1, fill the molding hole 120 and protrude from a main surface of the semiconductor substrate 100 to a predetermined height. The pocket line 155 includes a pocket conductive layer line 145, a lower metal layer line 149, and an upper metal layer line 152. A line capping layer pattern 165 is placed on the upper surface of the pocket line 155. A pocket insulating layer pattern 139 is placed under the pocket line 155, and the pocket insulating layer pattern 139 is preferably a silicon oxide ($SiO_2$) layer, and may be a silicon nitride oxide ($Si_xN_yO_z$) layer.

The pocket line 155 has lower and upper metal layer lines 149, 152 placed in the molding hole 120 on the active region. The top surfaces of the lower and upper metal layer lines 149, 152 may be higher than the main surface of the semiconductor substrate 100. Also, the width of the pocket line 155 protruding from the main surface of the semiconductor substrate 100 is preferably greater than the diameter of the molding hole 120 to overlap the semiconductor substrate 100 by a predetermined width W, but the width of the pocket line 155 may also be smaller than the diameter of the molding hole 120 to be inserted into the molding hole 120.

The lower and upper metal layer lines 149, 152 are encapsulated by the line capping layer pattern 165 and the pocket conductive layer line 145. The line capping layer pattern 165 is an insulating layer having an etching selectivity ratio different from the lower and upper metal layer lines 149, 152 and the pocket conductive layer line 145. The line capping layer pattern 165 is preferably a nitride layer such as a silicon nitride ($Si_3N_4$) layer. Alternatively, the line capping layer pattern 165 may be an oxide layer such as a silicon oxide ($SiO_2$) layer.

Preferably, the pocket conductive layer line 145 is preferably a doped polysilicon layer, and the lower and upper metal layer lines 149, 152 are preferably a tungsten nitride (WN) layer and a tungsten (W) layer, respectively. The lower and upper metal layer lines 149, 152 each may be formed of a metal having a high melting point.

Now, a description will be made on a method of fabricating a semiconductor device according to the invention.

FIGS. 2, 4, 6, 8, 10, 12, 14, and 16 are sectional views illustrating a method of fabricating the semiconductor device taken along line I–I' of FIG. 1, and FIGS. 3, 5, 7, 9, 11, 13, 15, and 17 are sectional views to illustrate a method of fabricating the semiconductor device taken along line II–II' of FIG. 1, respectively.

Referring to FIGS. 1, 2 through 5, a device isolation layer 106 is formed on the semiconductor substrate 100 to confine at least one active region 103. A buffer layer 109 and a molding hole pattern layer 110 are sequentially formed on the semiconductor substrate 100 having the device isolation layer 106 and the active region 103. The molding hole pattern layer 110 is formed of an insulating material having an etching selectivity ratio different from the buffer layer 109, and it is preferably formed of a nitride such as a silicon nitride, and the buffer layer 109 is formed of an oxide such as silicon oxide.

A photoresist layer covers the upper surface of the molding hole pattern layer 110, and a photoresist pattern 112 is formed by performing a photolithographic process on the photoresist layer. An etching process is performed on the molding hole pattern layer 110 by using the photoresist pattern 112 as an etching mask to form a molding hole pattern 114 exposing the buffer layer 109 on the semiconductor substrate 100. Then, the photoresist pattern 112 is removed from the semiconductor substrate 100 having the molding hole pattern 114.

The buffer layer 109 and the semiconductor substrate 100 are sequentially etched by using the molding hole pattern 114 and the device isolation layer 106 as an etching mask to form the molding hole 120 in the semiconductor substrate 100 on the active region 103. The molding hole 120 may be a trench hole that extends to a predetermined depth from the main surface of the semiconductor substrate 100. A thermal oxidation process is performed on the semiconductor substrate 100 to form a sacrificial layer 125 on the molding hole 120.

Referring to FIGS. 1, 6 through 9, a wet etch process is performed on the semiconductor substrate 100 having the sacrificial layer 125 to remove the molding hole pattern 114, and a self-alignment mask layer 130 covers the overall surface of the semiconductor substrate 100. The self-alignment mask layer 130 is preferably formed of doped polysilicon, but may be formed of undoped polysilicon.

A photoresist layer is formed on the upper surface of the self-alignment mask layer 130, and a photoresist pattern 132 is formed to expose a portion of the self-alignment mask layer 130. The portion of the self-alignment mask layer 130 is etched, using the photoresist pattern 132 as an etching mask, to form self-alignment masks 134. The self-alignment masks 134 traverse a direction perpendicular to the active region to expose the molding hole 120 as shown in FIG. 1. A thermal oxidation process is performed on the semiconductor substrate 100 having the self-alignment masks 134 to form a removal layer 136. The removal layer 136 is preferably formed of an oxide ($SiO_2$) layer. The removal layer 136 may be formed more on the upper surface and the sidewalls of the self-alignment masks 134 made of the doped polysilicon layer compared to the self-alignment mask made of the undoped polysilicon layer.

Referring to FIGS. 1, 10 through 13, a wet etch process may be performed on the semiconductor substrate 100 having the removal layer 136 to remove the removal layer 136, the sacrificial layer 125 and a part of the buffer layer 109 not protected by the self-alignment masks 134, and to expose a portion of the semiconductor substrate 100 having the molding hole 120 and the self-alignment masks 134. Then, a pocket insulating layer 138 is formed on the resulting structure.

A pocket conductive layer 143, a lower metal layer 147 and an upper metal layer 150 are sequentially formed on the pocket insulating layer 138. The upper metal layer 150 and the lower metal layer 147 are preferably formed of tungsten (W) and tungsten nitride (WN), respectively. Further, the lower and upper metal layers 147, 150 each may be formed of metal having a high melting point. The pocket conductive layer 143 is preferably formed of doped polysilicon having the same etching selectivity ratio as the self-alignment mask layer 130. Also, the pocket conductive layer 143 may be formed of a conductive layer having an etching selectivity ratio different from the self-alignment mask layer 130. There is a groove on the semiconductor substrate 100 having the pocket conductive layer 143, the lower metal layer 147 and the upper metal layer 150. The groove is formed on the upper surface of the upper metal layer 150 above the molding hole, and the upper surface of the upper metal layer 150 above the semiconductor substrate 100 having the device isolation layer 106.

Referring to FIGS. 1, 14 through 17, a planarization process is sequentially performed on the upper metal layer 150, the lower metal layer 147 and the pocket conductive layer 143 until the upper surface of the self-alignment masks 134 is exposed to form a pocket pattern 153. The pocket pattern 153 includes a pocket conductive layer pattern 144, a lower metal layer pattern 148, and an upper metal layer pattern 151, which are sequentially stacked between the self-alignment masks 134. If the self-alignment masks 134 are formed of doped polysilicon, the pocket insulating layer 138 in FIGS. 12 and 13 may be used as an etching mask in the planarization process. The planarization process may be performed by using a chemical mechanical polishing or an etching back.

A line capping layer 160 covers the overall surface of the semiconductor substrate 100 having the pocket pattern 153. The line capping layer 160 is formed of an insulating layer having an etching selectivity ratio different from the pocket conductive layer 143. A photoresist layer is formed on the line capping layer 160. A photolithographic process is performed in the photoresist layer to form a photoresist pattern 170. Then, an etching process is performed on the line capping layer 160 to form a line capping layer pattern 165, using the photoresist pattern 170 as an etching mask. The upper metal layer pattern 151, the lower metal layer pattern 148, and the pocket conductive layer pattern 144 are sequentially etched to form a pocket insulating layer pattern 139 and a pocket line 155, using the line capping layer pattern 165 as an etching mask. The self-alignment masks 134 are removed from the semiconductor substrate 100 during the formation of the pocket line 155 through the etching process or following other etching processes.

The pocket line 155 comprises a pocket conductive layer line 145, a lower metal layer line 149 and an upper metal layer line 152, which are sequentially stacked. The pocket line 155 is formed to traverse a direction perpendicular to the active region 103 as shown in FIG. 1, fill the molding hole 120 and protrude from the main surface of the semiconductor substrate 100. Furthermore, the pocket line 155 is formed such that the lower and upper metal layer lines 149, 152 are encapsulated by the line capping layer pattern 165 and the pocket conductive layer line 145, and the pocket line 155 is used as a gate line.

The width of the pocket line 155 is greater than the diameter of the molding hole 120, so that the pocket conductive layer line 145 overlap the semiconductor substrate 100 by a predetermined width W. Also, the width of the pocket line 155 may be smaller than the diameter of the molding hole 120, so that the pocket line 155 inserts into the molding hole 120. Therefore, the pocket line 155 filling the molding hole 120 can prevent oxidants from directly infiltrating the molding hole 120 through the pocket conductive layer line 145 and the pocket insulating layer pattern 139 during a thermal oxidation process.

As described above, in semiconductor devices having a pocket line and methods of fabricating the same according to embodiments of the invention, the lower and upper metal layer lines are encapsulated by the line capping layer pattern and the pocket conductive layer line. Therefore, the line capping layer pattern and the pocket conductive layer line can prevent the lower and upper metal layer lines from being oxidized during the thermal oxidation process, thereby obtaining a longer effective channel length than that of the conventional technology to enhance a current driving capability.

Embodiments of the invention will now be described in a non-limiting way.

Embodiments of the invention provide semiconductor devices having a pocket line suitable for enhancing a current driving capability and methods of fabricating the same.

According to some embodiments of the invention, there are provided semiconductor devices that includes at least one active region isolated by a device isolation layer in a semiconductor substrate. A molding hole is placed in the semiconductor substrate on the active region. A pocket insulating layer pattern conformally covers the molding hole and a main surface of the semiconductor substrate. A pocket line is placed to traverse in a direction perpendicular to the active region, fill the molding hole and be protruded from the main surface of the semiconductor substrate. At this time, the pocket line includes a pocket conductive layer line, a lower metal layer line and an upper metal layer line sequentially stacked on the pocket insulating layer pattern. And a line capping layer pattern is placed on the upper surface of the pocket line the pocket conductive layer line surrounds the lower and upper metal layer lines.

In accordance with some embodiments of the invention, there is provided methods of fabricating semiconductor devices that includes forming at least one active region isolated by a device isolation layer formed in a semiconductor substrate. A molding hole is formed in the semiconductor substrate on the active region. Self-alignment masks are formed on the semiconductor substrate having the molding hole to traversing in a direction perpendicular to the active region. At this time, the self-alignment masks expose the molding hole. A pocket insulating layer is formed on the semiconductor substrate having the self-alignment masks. And a pocket conductive layer, and lower and upper metal layers are sequentially formed on the pocket insulating layer. An etch process is performed in the upper metal layer, the lower metal layer, and the pocket conductive layer by using the self-alignment masks as etch masks to form a pocket pattern. At this time, the pocket pattern is formed to have a pocket conductive layer pattern, a lower metal layer pattern and an upper metal layer pattern. A line capping layer pattern is formed on the upper surface of the pocket pattern. The pocket pattern and the pocket insulating layer are patterned by using the line capping layer pattern as an etching mask to form a pocket insulating layer pattern and a pocket line. The pocket line is formed to have a pocket conductive layer line, a lower metal layer line and an upper metal layer line.

While the invention has been particularly shown and described with reference to exemplary embodiments thereof, it will be understood by those skilled in the art that the foregoing and other changes in form and details may be made therein without departing from the spirit and scope of the invention as defined in the following claims.

What is claimed is:

1. A semiconductor device comprising:
   an active region isolated by a device isolation layer placed in a semiconductor substrate having a main surface;
   a molding hole placed in the semiconductor substrate on the active region;
   a pocket insulating layer pattern conformally covering the molding hole;
   a pocket line extending across the active region, filling the molding hole and protruding from the main surface of the semiconductor substrate, the pocket line including a pocket conductive layer line, a lower metal layer line, and an upper metal layer line, which are sequentially stacked on the pocket insulating later pattern; and
   a line capping layer pattern placed on the pocket line, wherein the line capping layer pattern and the pocket conductive layer line surround the lower and upper metal layer lines.

2. The semiconductor device according to claim 1, wherein the molding hole comprises a trench hole.

3. The semiconductor device according to claim 1, wherein the pocket insulating layer pattern comprises a silicon oxide ($SiO_2$) layer.

4. The semiconductor device according to claim 1, wherein the pocket insulating layer pattern comprises a silicon nitride oxide ($Si_xN_yO_z$) layer.

5. The semiconductor device according to claim 1, wherein the lower and upper metal layer lines each comprise a metal having a high melting point.

6. The semiconductor device according to claim 1, wherein the lower and upper metal layer lines comprise a tungsten nitride (WN) layer and a tungsten (W) layer respectively.

7. The semiconductor device according to claim 1, wherein a width of the pocket line protruding from the main surface of the semiconductor substrate is greater than a diameter of the molding hole.

8. The semiconductor device according to claim 1, wherein a width of the pocket line protruding from the main surface of the semiconductor substrate is less than a diameter of the molding hole.

9. The semiconductor device according to claim 1, wherein top surfaces of the lower and upper metal layer lines are placed higher than the main surface of the semiconductor substrate.

10. The semiconductor device according to claim 1, wherein the lower and upper metal layer lines are placed in the molding hole on the active region.

11. A semiconductor device comprising:
    an active region isolated by a device isolation layer placed in a semiconductor substrate having a main surface;
    a molding hole placed in the semiconductor substrate on the active region;
    a pocket insulating layer pattern conformally covering the molding hole; and
    a pocket line extending across the active region, filling the molding hole and protruding from the main surface of the semiconductor substrate, the pocket line including a pocket conductive layer line, a lower metal layer line, and an upper metal layer line, which are sequentially stacked on the pocket insulating later pattern,
    wherein the pocket conductive layer line approximately surrounds the lower and upper metal layer lines to prevent oxidation thereof.

* * * * *